(12) United States Patent
Kanba

(10) Patent No.: US 7,146,549 B2
(45) Date of Patent: Dec. 5, 2006

(54) SCAN-PATH FLIP-FLOP CIRCUIT FOR INTEGRATED CIRCUIT MEMORY

(75) Inventor: Koji Kanba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 400 days.

(21) Appl. No.: 10/446,122

(22) Filed: May 28, 2003

(65) Prior Publication Data

US 2003/0226079 A1 Dec. 4, 2003

(30) Foreign Application Priority Data

May 29, 2002 (JP) .............................. 2002-155506

(51) Int. Cl.
*G01R 31/28* (2006.01)
(52) U.S. Cl. ...................... 714/726; 714/729
(58) Field of Classification Search ................ 714/729, 714/732, 731, 733, 726; 327/202; 713/500
See application file for complete search history.

(56) References Cited

U.S. PATENT DOCUMENTS

| | | | | |
|---|---|---|---|---|
| 5,210,759 | A * | 5/1993 | DeWitt et al. .............. | 714/731 |
| 5,257,223 | A | 10/1993 | Dervisoglu | |
| 5,592,493 | A * | 1/1997 | Crouch et al. ............. | 714/729 |
| 5,872,794 | A * | 2/1999 | Cook et al. ................ | 714/732 |
| 5,905,737 | A | 5/1999 | Osawa et al. | |
| 6,094,736 | A | 7/2000 | Komoike | |
| 6,182,256 | B1 | 1/2001 | Qureshi | |
| 6,380,780 | B1 * | 4/2002 | Aitken et al. .............. | 327/202 |
| 6,490,702 | B1 * | 12/2002 | Song et al. ................ | 714/726 |
| 6,539,491 | B1 * | 3/2003 | Skergan et al. ............ | 713/500 |
| 6,654,920 | B1 * | 11/2003 | Hetherington et al. ...... | 714/733 |
| 6,662,324 | B1 * | 12/2003 | Motika et al. ............. | 714/726 |
| 6,668,347 | B1 * | 12/2003 | Babella et al. ............ | 714/733 |
| 2002/0078410 | A1 | 6/2002 | Matsushima | |

FOREIGN PATENT DOCUMENTS

| | | |
|---|---|---|
| EP | 0 461 041 B1 | 12/1997 |
| JP | 61-020143 | 1/1986 |
| JP | 05-157807 | 6/1993 |
| JP | 10-197604 | 7/1998 |
| JP | 11-153650 | 6/1999 |

(Continued)

OTHER PUBLICATIONS

European Search Report dated Jul. 4, 2005.

(Continued)

*Primary Examiner*—David Ton
(74) *Attorney, Agent, or Firm*—McGinn IP Law Group, PLLC

(57) ABSTRACT

A scan-path flip-flop circuit for an integrated circuit memory comprises a number of successively arranged flip-flops. Each flip-flop comprises a master latching circuit for latching a first signal supplied from an associated input terminal of the integrated circuit memory in response to a normal-mode clock signal, supplying the latched first signal to the integrated circuit memory, and further latching a second signal in response to a first scan-mode clock signal. The first signal from the master latching circuit is latched in a slave latching circuit in response to the normal-mode clock signal, and the second signal from the master latching circuit is latched in the slave latching circuit in response to a second scan-mode clock signal. The slave latching circuit of each preceding flip-flop is connected to the master latching circuit of a succeeding flip-flop for shifting the second signal in response to the first scan-mode clock signal.

8 Claims, 4 Drawing Sheets

FOREIGN PATENT DOCUMENTS

| | | |
|---|---|---|
| JP | 2001-015607 | 1/2001 |
| JP | 2001-142736 | 5/2001 |
| JP | 2001-183424 | 7/2001 |
| JP | 2002-148309 | 5/2002 |

OTHER PUBLICATIONS

Japanese Pffice Action dated Aug. 29, 2006 (with partial English translation).

* cited by examiner

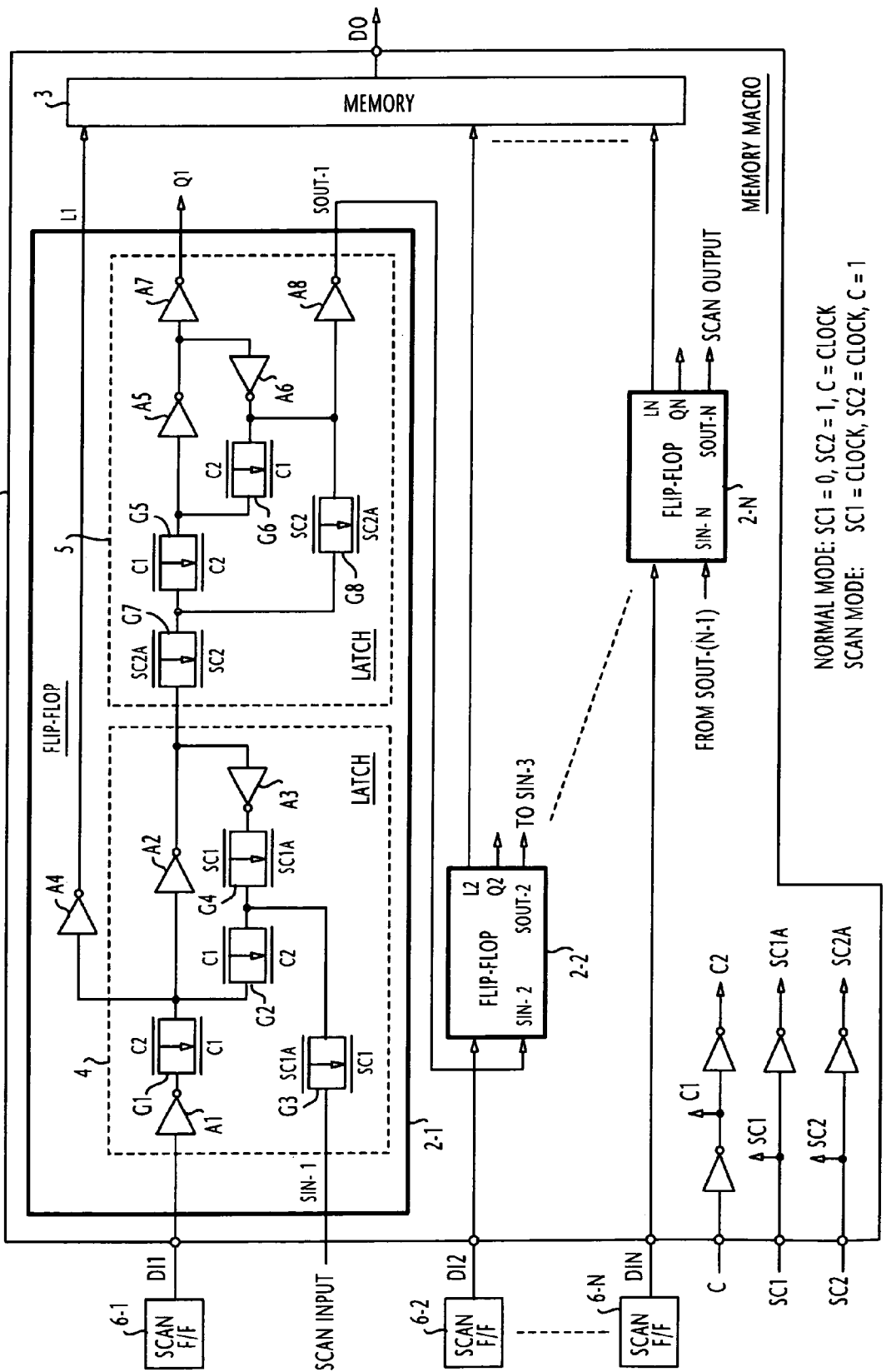

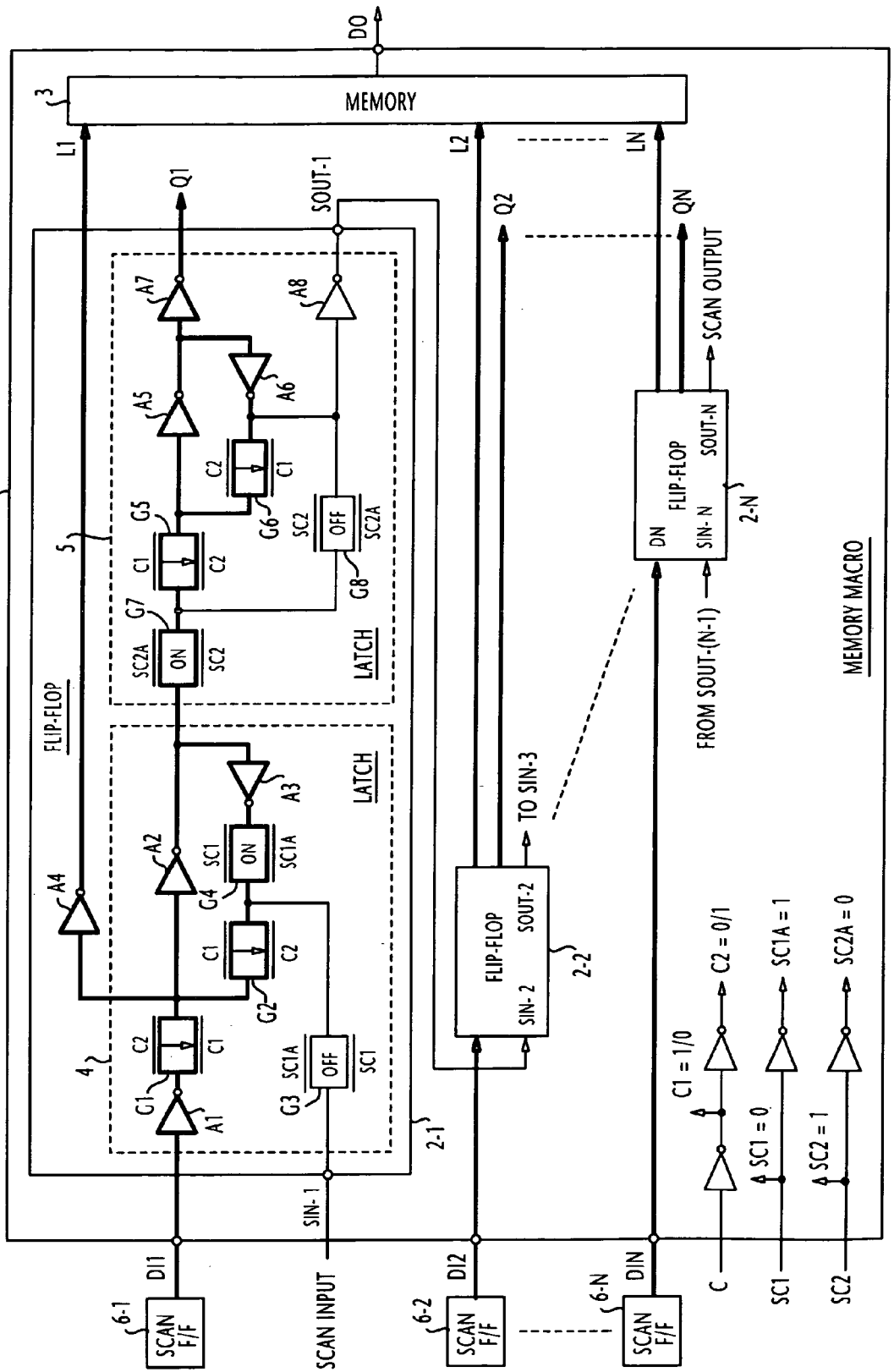
FIG. 2A NORMAL MODE

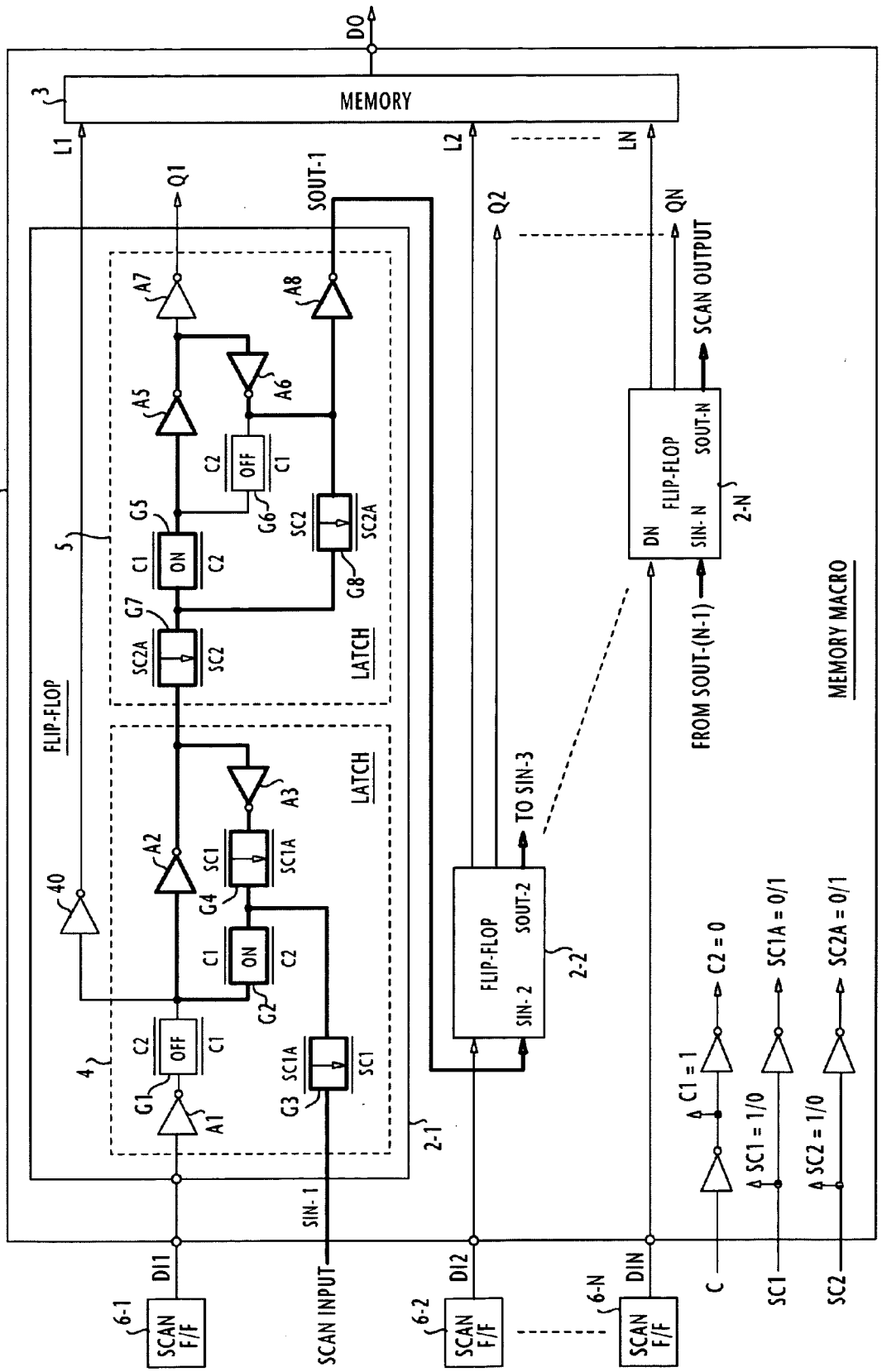
FIG. 2B SCAN MODE

SCAN-PATH FLIP-FLOP CIRCUIT FOR INTEGRATED CIRCUIT MEMORY

BACKGROUND OF THE INVENTION

1. Field of the Invention

The present invention relates to a scan-path flip-flop circuit for an integrated circuit memory.

2. Description of the Related Art

Japanese Patent Publication 2001-183424 discloses an integrated circuit in which a standard cell and a custom cell are combined. A scan-mode test circuit is provided in the custom cell for testing the boundary between the two cells. The test circuit is comprised of logic gates whose inputs are connected to the standard cell and whose outputs are connected through return paths to the standard cell. A test pattern is applied to each logic gate for testing a border area between the two cells. However, if the disclosed test circuit is employed for testing data input terminals of an integrated circuit memory, a dedicated set of logic gates and a dedicated set of test terminals would be provided to observe different states of each logic gate. The test pattern required for testing the data input terminals is a pattern capable of verifying all possible states of each logic gate. Thus, the test pattern would become long and impracticable.

Japanese Patent Publication 2001-142736 discloses an integrated circuit incorporating two groups of double-latch scan-path flip-flops, with one group being located between a first user logic and a macro cell and the other being located between a second user logic and the macro cell. The two groups of double-latch flip-flops are connected to form a scan path. The double-latch flip-flops hold a test pattern for testing the macro cell and a test pattern for testing the user logic. These test patterns are combined together to permit testing to be made simultaneously on the macro cell and the user logic. The macro cell is tested by shifting a normal-mode data signal through the scan-path flip-flops. Using a scan test, a failure which would occur between a data input terminal and a data output terminal is detected.

However, the scan-path flip-flops are only used for testing the macro cell and the user logic circuits. These flip-flops are thus dedicated for testing, and not used for user logic.

Therefore, there is a need to provide a scan-path flip-flop circuit capable of testing terminals of an integrated circuit with a short test pattern and capable of being efficiently used for purposes other than testing.

SUMMARY OF THE INVENTION

It is therefore an object of the present invention to provide a scan-path flip-flop circuit for an integrated circuit memory, the scan-path flip-flop circuit being capable of testing terminals of the integrated circuit memory with a short test pattern and capable of being efficiently used for purposes other than testing.

According to the present invention, there is provided a test circuit for an integrated circuit memory, comprising a scan-path flip-flop circuit capable of performing a latching operation, the scan-path flip-flop circuit being connected to a plurality of input terminals of the integrated circuit memory for producing a plurality of latched signals in response to signals applied to the input terminals and applying the latched signals to the integrated circuit memory.

Specifically, the scan-path flip-flop circuit comprises a plurality of successively arranged flip-flops. Each of the flip-flops comprises a master latching circuit for latching a first signal supplied from one of a plurality of input terminals of the integrated circuit memory in response to a normal-mode clock signal supplying the latched first signal to the integrated circuit memory, and latching a second signal in response to a first scan-mode clock signal. A slave latching circuit is provided for latching the first signal from the master latching circuit in response to the normal-mode clock signal, and latching the second signal from the master latching circuit in response to a second scan-mode clock signal. The slave latching circuit of each preceding flip-flop is connected to the master latching circuit of a succeeding flip-flop for shifting the second signal in response to the first scan-mode clock signal.

BRIEF DESCRIPTION OF THE DRAWINGS

The present invention will be described in detail further with reference to the following drawings, in which:

FIG. 1 is a block diagram of a scan-path flip-flop circuit according to a first embodiment of the present invention;

FIG. 2A is a block diagram of the scan-path flip-flop circuit of FIG. 1 when operating in a normal mode;

FIG. 2B is a block diagram of the scan-path flip-flop circuit of FIG. 1 when operating in a scan test mode.

DETAILED DESCRIPTION

Figure 3:
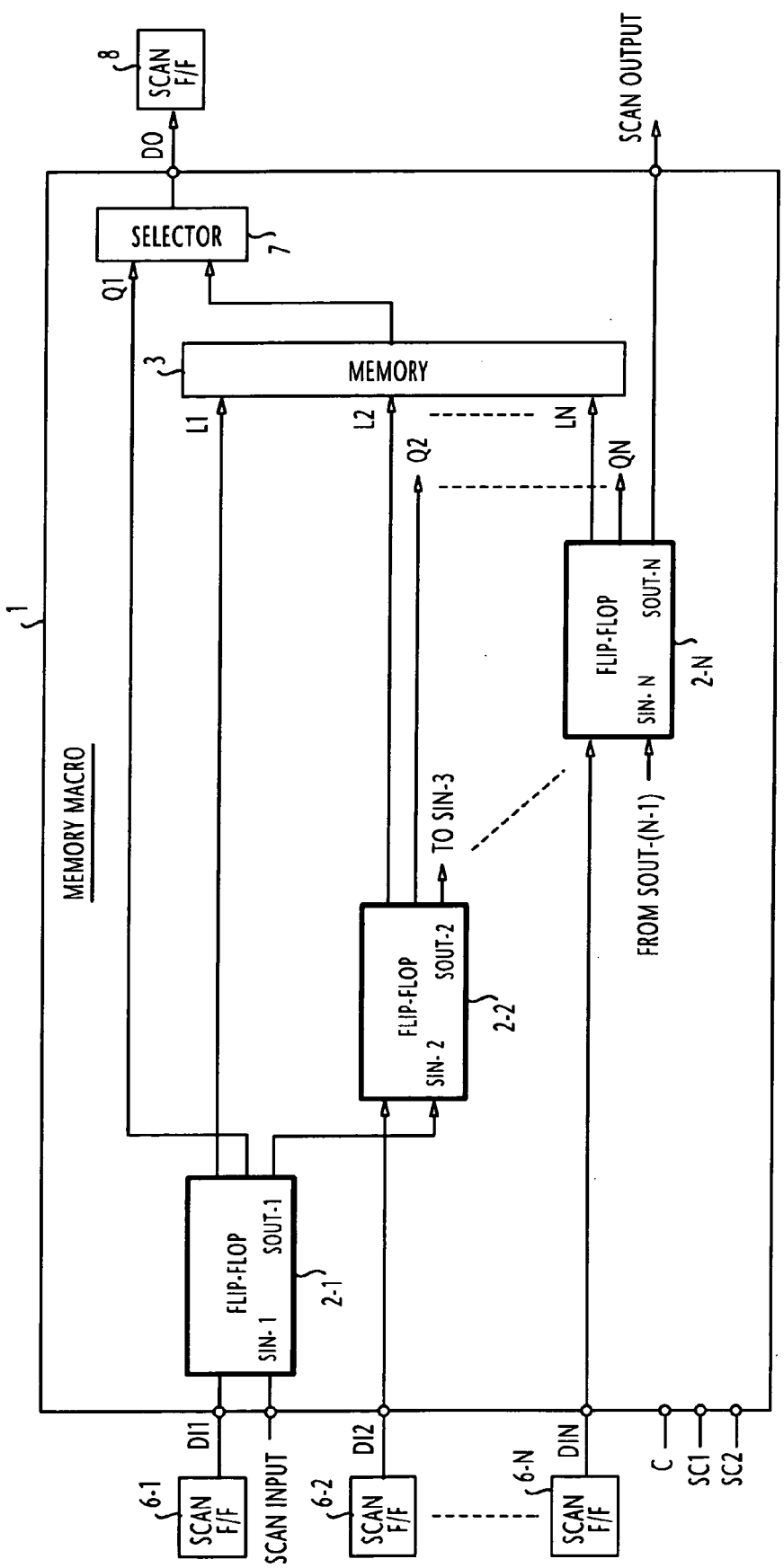
FIG. 3 is a block diagram of a scan-path flip-flop circuit according to a second embodiment of the present invention.

Referring to FIG. 1, there is shown a scan-path flip-flop circuit for an integrated circuit memory, or a memory macro, according to a first embodiment of the present invention. The scan-path flip-flop circuit, indicated by numeral 1, includes a plurality of successively arranged flip-flops 2-1 to 2-N of identical configuration respectively connected to data input terminals DI1 to DIN, As will be described, each of the flip-flops 2 is characterized by the ability to perform a latching function as well as a flip-flop function. By the provision of such flip-flops at data input terminals DI1 through DIN of the memory macro, the data input terminals can be tested with a short test pattern. The outputs of the flip-flops 2 are connected to the memory 3 whose output is connected to a data output terminal DO of the memory macro.

Each of the flip-flops 2 is clocked by a normal-mode clock signal C when they operate in a normal mode in which they receive normal-mode data signals from the associated data input terminals DI. When they operate in a test mode, the flip-flops are clocked by two mutually exclusive scan-mode clock signals SC1 and SC2 by forming a scan path between a scan input terminal SIN-1 and a scan output terminal SOUT-N and shifting a scan-mode data signal through the scan path. Complementary components of each clock signal are generated and supplied to appropriate transmission gates, as illustrated.

As a representative flip-flop, the flip-flop 2-1 is shown in detail as compromising a master latching circuit 4 and a slave latching circuit 5. Master latching circuit 4 includes first to fourth bidirectional transmission gates G1, to G4 and inverters A1 to A3. Slave latching circuit 5 includes fifth to eighth transmission gates G5 to G8 and inverters A5 to A8. Flip-flop 2-1 further includes and inverter A4. This inverter is connected to the output of the transmission gate G1 to extract a normal-mode data signal to be latched in the master latching circuit 4 for application to the memory 3 via an output terminal L1.

In the master latching circuit 4, the transmission gates G1 and G2 operate in response to the complementary components of the normal-mode clock signal C and the transmission gates G3 and G4 operate in response to the complementary components of the scan-mode clock signal SC1.

In the slave latching circuit 5, the transmission gates G5 and G6 operate in response to the complementary components of the normal-mode clock signal C and the transmission gates G7 and G8 operate in response to the complementary components of the scan-mode clock signal SC2.

During the normal mode of operation (see FIG. 2A), the scan-mode clock signals SC1 and SC2 are set to 0 and 1, respectively, and each flip-flop is clocked by the normal-mode clock signal C. The circuit elements active during the normal mode are indicated in FIG. 2A by thick lines.

In the master latching circuit 4, the gates G3 and G4 are set in the OFF and ON states respectively by the scan-mode clock signal SC1=0 and the gates GI and G2 are complementarily clocked to each other in response to the normal-mode clock signal C. When the gate G1 is clocked into an ON state and the gate G2 is clocked into an OFF state, a normal-mode data signal from an associated scan flip-flop 6 is supplied through the data input terminal D11 and received in the gate GI. When the gates G1 and G2 are subsequently clocked into OFF and ON states respectively, a loop is formed by the gates G2, G4, A2, A3 and the received normal-mode data signal is latched into this loop. The latched data signal is extracted by the inverter A4 to the memory 3.

In the slave latching circuit 5, the gates G7 and G8 are set to ON and OFF states, respectively, by the scan-mode clock signal SC2=1 and the gates G5 and G6 are clocked complementarily to each other in response to the normal-mode clock signal C. When the gates G5 and G6 are clocked into ON and OFF states respectively, the normal-mode data signal from the master latching circuit 4 is received in the gate G5. When the gates G5 and G6 are subsequently clocked into OFF and ON states respectively, a loop is formed by the gate G6 and inverters A5, A6 and the received normal-mode data signal is latched in this loop. The latched data signal is extracted by the inverter A7 to the associated output terminal Q1.

During the scan mode (see FIG. 2B), the normal-mode clock signal is set to 1 and each flip-flop is clocked by the scan-mode clock signals SC1 and SC2. The circuit elements active during the scan mode are indicated in FIG. 2B by thick lines.

In the master latching circuit 4, the gates G1 and G2 are set in the OFF and ON states respectively by the normal-node clock signal C=1 and the gates G3 and G4 are complementarily clocked to each other in response to the scan-mode clock signal SC1. When the gates G3 and G4 are respectively clocked into ON and OFF states by the scan-mode dock signal SC1, a scan-mode data signal from the associated scan input terminal SIN-1 is received in the gate G3. When the gates G3 and G4 are subsequently clocked into OFF and ON states respectively, a loop is formed by gates G2, G4 and inverters A2, A3 and the received scan-mode data signal is latched in this loop.

In the slave latching circuit 5, the gates G5 and G6 are respectively set in the ON and OFF states by the normal-mode clock signal C=1 and the gates G7 and G8 are clocked complementarily to each other in response to the scan-mode clock signal SC2. When the gates G7 and G8 are clocked into ON and OFF states respectively, the scan-mode data signal from the master latch circuit 4 is received by the gate G7. When the gates G7 and G8 are subsequently docked into OFF and ON states respectively, a loop is formed by gates G5, G8 and inverters A5, A6 and the scan-mode data signal is latched into this loop. The latched scan-mode data signal is extracted by the inverter A8 for application to the scan output terminal SOUT-1.

The scan output terminal SOUT-1 of flip-flop 2-1 is connected to the scan input terminal SIN-2 of flip-flop 2-2, and so forth Therefore, the scan output terminal of each preceding flip-flop is connected to the scan input terminal of a succeeding flip-flop to form a scan path from the input terminal SIN-1 to the output terminal SOUT-N.

Therefore, all flip-flops 2 are capable of operating as flip-flops as well as latches during normal mode, and capable of forming a scan path during test mode.

Data input terminals DI1 through DIN can be tested by setting test signals into the scan flip-flops 6-1 through 6-N and shifting the test data to the associated flip-flops 2-1 through 2-N. Failed data input terminals can be detected by monitoring the outputs of all flip-flops 2. Due to the absence of the logic gates and return paths as employed in Japanese Patent Publication 2001-183424, the present invention allows the data input terminals to be tested with a short test pattern. As a result, the present invention provides short test time, low test cost and ease with which a test pattern is produced.

In addition, since the scan-path flip-flop circuit of the present invention requires small space, it can be advantageously used for space savings purposes in a memory such as a synchronous RAM as a replacement of the latching circuits internally provided in the RAM as a built-in unit. Furthermore, since the scan-path flip-flop circuit of the present invention can be operated as individual flip-flops, it can be advantageously used in an integrated circuit which includes flip-flop logic function.

Further, the scan-path flip-flops 2 of the present invention can be used not only as a scan path test circuit, but also as a user logic circuit, which is in contrast to Japanese Patent Publication 2001-142736 where the user logic circuits require dedicated flip-flops.

FIG. 3 shows a second embodiment of the present invention in which a selector 7 is additionally connected between the output terminal of memory 3. Selector 7 has a first input terminal connected to the output of the memory 2 and a second input terminal connected to the output terminal Q1 of the flip-flop 2-1. During a scan mode, the selector 7 is switched for coupling a logic value from the Q1 output of flip-flop 2-1 to a scan flip-flop 8 through data output terminal DO, During a normal mode, the selector is switched for coupling the output of the memory 3 to data output terminal DO.

By setting test data in the scan flip-flops 6-1 through 6-N, feeding the test data into the flip-flops 2-1 through 2-N, and shifting the test data to the scan flip-flop 8 By observing the signal received by the scan flip-flop 8, the data output terminal DO as well as all input data terminals DI can be tested.

What is claimed is:

1. A scan-path flip-flop circuit for a macro block, comprising:
   a plurality of successively arranged flip-flops, each of the flip-flops comprising:
   a master latching circuit, responsive to a normal-mode clock signal, for receiving a first signal from one of a plurality of input terminals and supplying the received first signal to said macro block and latching the received first signal and responsive to a first scan-mode clock signal for receiving a second signal and latching the received second signal; and a slave latching circuit, responsive to said normal-mode clock signal for receiving the first signal from the master latching circuit and latching that received first signal responsive to a second scan-mode clock signal for receiving the second signal from the master latching circuit and latching the received second signal;

the master latching circuit of each succeeding flip-flop being connected to the slave latching circuit of a preceding flip-flop for receiving said second signal from the preceeding flip-flop in response to the first scan-mode clock signal.

2. The scan-path flip-flop circuit of claim 1, further comprising:

a selector for selecting an output signal of said macro block during a normal mode and selecting the first signal which is latched in the slave latching circuit of one of said flip-flops during a test mode and supplying the selected signal to an output terminal.

3. The scan-path flip-flop circuit of claim 1, wherein the master latching circuit comprises first and second gates which are clocked complementarily to each other in response to said normal-mode clock signal for latching said first signal, and third and fourth gates which are clocked complementarily to each other in response to said first scan-mode clock signal for latching said second signal; and wherein said slave latching circuit comprises:
fifth and sixth gates which are clocked complementarily to each other in response to said normal-mode clock signal for latching the first signal from said master latching circuit, and
seventh and eight gates which are clocked complementarily to each other in response to said second scan-mode clock signal for latching the second signal from said master latching circuit.

4. The scan-path flip-flop circuit of claim 3,
wherein said second and fourth gates are connected in series to form part of a first loop for latching said first signal when said first and second gates are clocked complementarily to each other and said third and fourth gates are turned OFF and ON respectively, and for latching said second signal when said third and fourth gates are clocked complementarily to each other and said first and second gates are turned OFF and ON, respectively,
wherein said sixth gate is arranged to form part of a second loop for latching said first signal when said fifth and sixth gates are clocked complementarily to each other and said seventh and eight gates are turned ON and OFF, respectively, and
wherein said fifth and eighth gates are connected in parallel with said sixth gate to form part of a third loop for latching said second signal when said seventh and eighth gates are clocked complementarily to each other and said fifth and sixth gates are turned ON and OFF, respectively.

5. An apparatus, comprising:
a macro block; and
a scan-path flip-flop circuit for said macro block, said scan-path flip-flop circuit comprising:
a plurality of successively arranged flip-flops, each of the flip-flops comprising:
a master latching circuit for latching a normal-mode clock signal for receiving a first signal supplied from one of a plurality of input terminals, supplying the received first signal to said macro block and latching the received first signal, and responsive to a first scan-mode clock signal for receiving a second signal and latching the received second signal; and a slave latching circuit responsive to said normal-mode clock signal for receiving the first signal from the master latching circuit and latching the received first signal, and responsive to a second scan-mode clock signal for receiving said second signal from the master latching circuit and latching the received second signal, the master latching circuit of each succeeding flip-flop being connected to the slave latching circuit of a preceding flip-flop for receiving said second signal from the preceding flip-flop in response to the first scan-mode clock signal.

6. The apparatus of claim 5, wherein said scan-path flip-flop circuit further comprises a selector for selecting an output signal of said macro block during a normal mode and selecting the first signal which is latched in the slave latching circuit of one of said flip-flops during a test mode and supplying the selected signal to an output terminal.

7. The apparatus of claim 5, wherein the master latching circuit comprises first and second gas which are clocked complementarily to each other in response to said normal-mode clock signal for latching said first signal, and third and fourth gates which are clocked complementarily to each other in response to said first scan-mode clock signal for latching said second signal and wherein said slave latching circuit comprises:
fifth and sixth gates which are clocked complementarily to each other in response to said normal-mode clock signal for latching the first signal from said master latching circuit, and
seventh and eighth gates which are clocked complementarily to each other in response to said second scan-mode clock signal for latching the second signal from said master latching circuit.

8. The apparatus of claim 7,
wherein said second and fourth gates are connected in series to form part of a first loop for latching said first signal when said first and second gates are clocked complementarily to each other and said third and fourth gates are turned OFF and ON respectively, and for latching said second signal when said third and fourth gates are clocked complementarily to each other and said first and second gates are turned OFF and ON, respectively,
wherein said sixth gate is arranged to form part of a second loop for latching said first signal when said fifth and sixth gates are clocked complementarily to each other and said seventh and eight gates are turned ON and OFF, respectively, and
wherein said fifth and eighth gates are connected in parallel with said sixth gate to form part of a third loop for latching said second signal when said seventh and eighth gates are clocked complementarily to each other and said fifth and sixth gates are turned ON and OFF, respectively.

* * * * *